United States Patent
Devers

(10) Patent No.: US 12,456,657 B2
(45) Date of Patent: Oct. 28, 2025

(54) HEAT DISSIPATING ELEMENT

(71) Applicant: STMicroelectronics (Grenoble 2) SAS, Grenoble (FR)

(72) Inventor: Michel Devers, Lumbin (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 527 days.

(21) Appl. No.: 17/945,638

(22) Filed: Sep. 15, 2022

(65) Prior Publication Data
US 2023/0100750 A1 Mar. 30, 2023

(30) Foreign Application Priority Data
Sep. 24, 2021 (FR) ........................................ 2110078

(51) Int. Cl.
*H01L 23/367* (2006.01)
*H01L 23/00* (2006.01)
*H01L 23/31* (2006.01)

(52) U.S. Cl.
CPC ........ *H01L 23/367* (2013.01); *H01L 23/3121* (2013.01); *H01L 24/32* (2013.01); *H01L 24/48* (2013.01); *H01L 24/73* (2013.01); *H01L 24/16* (2013.01); *H01L 2224/16227* (2013.01); *H01L 2224/32225* (2013.01); *H01L 2224/48227* (2013.01); *H01L 2224/73265* (2013.01)

(58) Field of Classification Search
CPC ... H01L 23/367; H01L 23/3121; H01L 24/32; H01L 24/48; H01L 24/73; H01L 24/16; H01L 2224/16227; H01L 2224/32225; H01L 2224/48227; H01L 2224/73265
See application file for complete search history.

(56) References Cited

U.S. PATENT DOCUMENTS

| 6,580,167 B1* | 6/2003 | Glenn ................. H01L 23/4334 257/713 |
| 9,165,855 B1* | 10/2015 | Yow ....................... H01L 21/565 |
| 2006/0087015 A1 | 4/2006 | Yuan et al. |
| 2009/0039485 A1 | 2/2009 | Lee |
| 2011/0124158 A1 | 5/2011 | Wu et al. |
| 2022/0139811 A1* | 5/2022 | Kassim ............... H01L 23/3107 257/676 |

FOREIGN PATENT DOCUMENTS

| CN | 101826470 A | 9/2010 |
| EP | 2631941 A3 | 4/2015 |
| WO | 02061830 A1 | 8/2002 |

OTHER PUBLICATIONS

INPI Search Report and Written Opinion for priority application, FR 2110078, report dated Jun. 14, 2022, 7 pgs.

* cited by examiner

*Primary Examiner* — Peniel M Gumedzoe
(74) *Attorney, Agent, or Firm* — Crowe & Dunlevy LLC

(57) ABSTRACT

An electronic device includes an electronic die in a package and a heat diffusion element. The heat diffusion element is made of a thermally-conductive material and is formed of a single block (unitary body) that includes: a main portion resting on at least a portion of an upper surface of the electronic die; at least one secondary portion flush with an upper surface of the package; and at least one intermediate portion coupling the main portion to the at least one secondary portion.

20 Claims, 4 Drawing Sheets

HEAT DISSIPATING ELEMENT

PRIORITY CLAIM

This application claims the priority benefit of French Application for Patent No. 2110078, filed on Sep. 24, 2021, the content of which is hereby incorporated by reference in its entirety to the maximum extent allowable by law.

TECHNICAL FIELD

The present disclosure generally concerns electronic devices and, more particularly, electronic die packages.

PRIOR ART

Heat dissipation is an important issue, partly resulting from the miniaturization of electronic devices.

Indeed, electronic devices are increasingly small, and increasingly powerful, which causes an ever-increasing need to dissipate the heat generated by the device. In the case where the generated heat is not dissipated, thermal effects risk damaging the neighboring circuits, which are being positioned closer and closer. Among degradations caused by thermal effects, the degradation of electric wires or leads, the delamination of power module solders, the occurrence of leakage currents, the impact on the reliability of components, the resistance of alloys, etc., may in particular be mentioned.

Further, certain components, such as phase-change memories, have a temperature-dependent behavior, which risks being modified by the temperature of other components.

Heat dissipation is thus essential. Accordingly, the use of cooling systems with a higher performance in terms of heat dissipation is crucial.

There is a need in the art to overcome all or part of the disadvantages of known dissipation elements.

SUMMARY

In an embodiment, an electronic device comprises: an electronic die in a package, and a heat diffusion element, the heat diffusion element being made of a thermally-conductive material. The heat diffusion element comprises: a main portion resting on at least a portion of an upper surface of the die; at least one secondary portion flush with an upper surface of the package; and at least one intermediate portion coupling the main portion to the at least one secondary portion.

Another embodiment provides a method of manufacturing an electronic device comprising the forming of an electronic die in a package, and a heat diffusion element, the heat diffusion element being made of a thermally-conductive material. The heat diffusion element comprises: a main portion resting on at least a portion of an upper surface of the die; at least one secondary portion flush with an upper surface of the package; and at least one intermediate portion coupling the main portion to the at least one secondary portion.

According to an embodiment, the heat diffusion element is formed of a single block (in other words, it is a unitary or monolithic body).

According to an embodiment, the main portion is located in a first plane and the at least one secondary portion is located in a second plane, the first and second planes being distinct and parallel.

According to an embodiment, the distance between the first and second planes is greater than 90 nm.

According to an embodiment, each secondary portion is formed of a first portion having, in the second plane, the shape of a rectangle and a second portion having, in the second plane, the shape of a trapezoid, one side of the rectangle and the long base of the trapezoid being contiguous.

According to an embodiment, the main portion rests on at least 75% of the upper surface of the die.

According to an embodiment, the die is electrically coupled to a support by a lower surface of the die, the main portion entirely covering the upper surface of the die.

According to an embodiment, the die is electrically coupled to a support by electric wires, the main portion partially covering the upper surface of the die.

According to an embodiment, the package comprises a protection layer, the at least one secondary portion being flush with an upper surface of the protection layer.

According to an embodiment, the main portion is covered with a region of the protection layer.

According to an embodiment, the electric wires are separated from the element by a region of the protection layer.

According to an embodiment, the main portion is bonded to the die by thermal glue.

According to an embodiment, the element comprises four secondary portions and four intermediate portions, each secondary portion being coupled by one of the intermediate portions to a different side of the main portion.

According to an embodiment, for each secondary portion, the short base of the trapezoid is contiguous to a side of the intermediate portion coupling said secondary portion to the main portion.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1A:
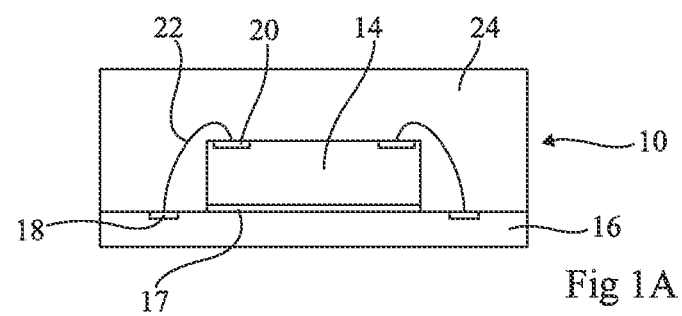
FIGS. 1A and 1B show two examples of die packages.
Figure 1B:
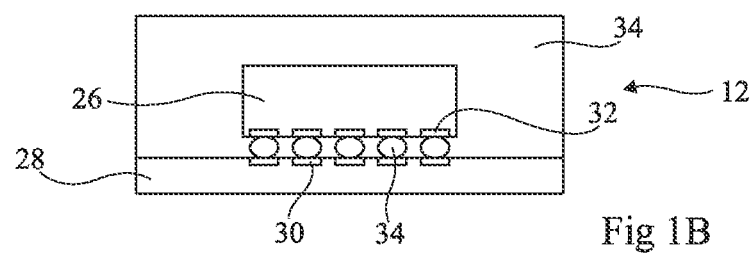

FIGS. 1A and 1B show two examples of electronic devices 10 and 12. More precisely, each of FIGS. 1A and 1B shows an example of an electronic device. Each electronic device comprises a die package, and an electronic die in the package.

FIG. 1A is a cross-section view of a device 10 where electric connections are formed by wire bonding between the package and the die.

Device 10 comprises a die 14. Die 14 is an integrated circuit die and, for example, comprises electronic components. Device 10 further comprises a package surrounding and protecting die 14. The package comprises a support, or substrate, 16.

Die 14 is bonded to support 16, for example by a bonding layer 17, for example made of glue, for example, electrically-insulating glue.

Support 16, for example, comprises an interconnection network, not shown. In other words, support 16, for example, comprises insulating layers comprising electrically-conductive tracks and electrically-conductive vias. In particular, support 16 comprises electrically-conductive tracks 18 flush with the upper surface of the support, that is, the surface closest to the die. Conductive tracks 18 are, for example, made of metal. Conductive tracks 18 are located around die 14, that is, around the region having die 14 bonded thereto.

Die 14 comprises connection pads 20 flush with the upper surface of die 14, that is, the surface most distant from support 16. Pads 20 and tracks 18 are coupled by electric leads or wires 22. Wires 22 thus extend from the upper surface of support 16 to the upper surface of die 14.

The package further comprises a protection layer 24, for example made of resin, covering support 16, die 14, and wires 22. In particular, layer 24 covers the upper surface of support 16, the upper surface of die 14, and wires 22.

FIG. 1B is a cross-section view of a device 12 where electric connections are formed by solder balls located between the package and the die. This, thus, is a "flip chip" bonding.

Device 12 comprises a die 26. Die 26 is an integrated circuit die and, for example, comprises electronic components. Device 12 further comprises a package surrounding and protecting die 26. The package comprises a support, or substrate, 28.

Support 28, for example, comprises an interconnection network, not shown. In other words, support 28, for example, comprises insulating layers comprising electrically-conductive tracks and electrically-conductive vias. In particular, support 28 comprises electrically-conductive tracks 30 flush with the upper surface of the support, that is, the surface closest to the die. Dies 30 are, for example, made of metal. Conductive tracks 30 are located in the region having die 26 located in front thereof.

Die 26 comprises connection pads 32 flush with the lower surface of die 26, that is the surface closest to support 28. Pads 32 and tracks 30 are coupled by solder balls 34. Each solder ball is in contact with a track 30 and a pad 32. The conductive balls thus form electric connections between the die and the support and bond the die to the support.

The package further comprises a protection layer 34, for example, made of resin, covering support 28 and die 26. In particular, layer 34 covers the upper surface of support 28 and the upper surface of die 26.

There is a need for heat dissipation elements in the packages of electronic dies, for example, in packages of the types described in relation with FIGS. 1A and 1B.

Figure 2:
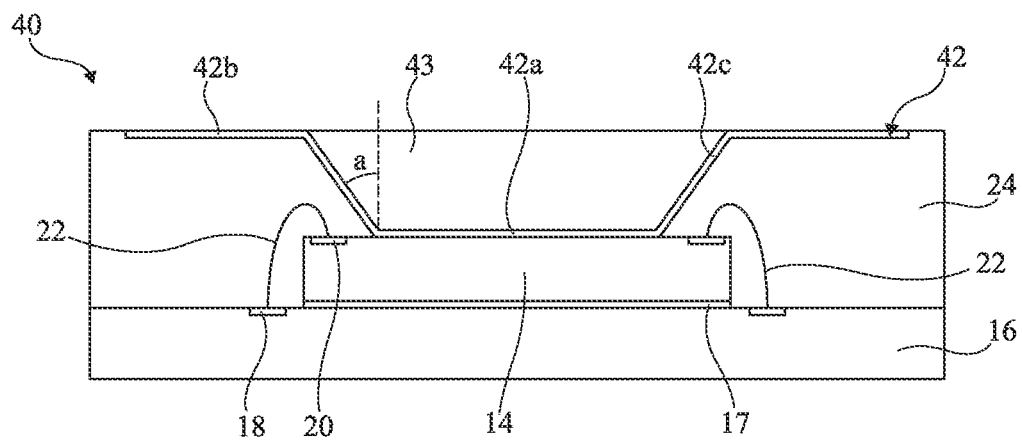
FIG. 2 shows a cross-section view of an embodiment of a package comprising a heat dissipating element.
Figure 3:
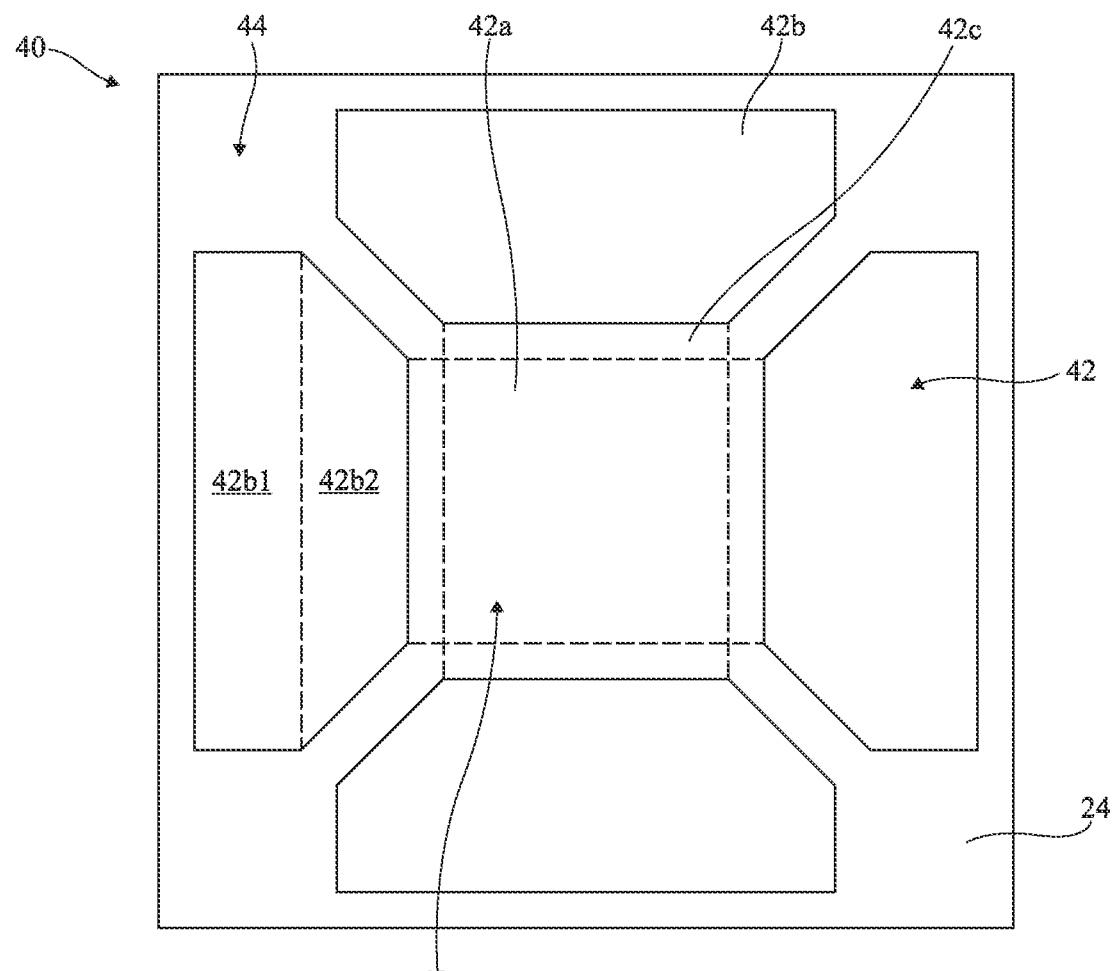
FIG. 3 shows a top view of the embodiment of FIG. 2.

FIG. 2 shows a cross-section view of an embodiment of a device 40 comprising a heat dissipating element. FIG. 3 shows a top view of the embodiment of FIG. 2. More precisely, device 40 is a device of the type described in relation with the FIG. 1A. In other words, device 40 comprises support 16, die 14, bonding layer 17, metal layers 18, connection pads 20, protection layer 24, and wires 22.

Device 40 further comprises an element 42 for dissipating the heat generated by die 14. Element 42 thus is a heat extractor, ensuring that the heat generated by die 14 is extracted from the package to the outer environment of device 40.

Element 42 comprises a main portion, or central portion, 42a in contact with die 14. Main portion 42a is not in the plane of FIG. 3 and is thus shown in dotted lines. Main portion 42a is in contact with at least a portion of the upper surface of die 14, preferably only with the upper surface of die 14. In the embodiment of FIG. 2, that is, in the case of a device where the die and the support are electrically coupled by electric wires 22, main portion 42a partially covers the upper surface of the die. Thus, certain portions, in particular the regions of the upper surface of the die where pads 20 and wires 22 are located, are not covered with main portion 42a. Preferably, main portion 42a is not in physical or electric contact with pads 20 and wires 22.

Main portion 42a is bonded to die 14. For example, portion 42a is bonded to die 14 by a bonding layer, for example, thermal glue, that is, glue allowing a heat transfer, that is, glue having a thermal conductivity greater than 32 W/mK. Main portion 42a is covered with a region 43 of layer 24. Region 43 thus enables to hold element 42.

To allow an efficient diffusion of heat between the die and element 42, portion 42a preferably covers at least 75% of the upper surface of die 14.

Element 42 further comprises at least one secondary portion, or fin, 42b. In the example of FIGS. 2 and 3, element 42 comprises four distinct fins 42b. In other words, element 42 comprises four fins 42b separated from one another and which are not in physical contact with one another.

Each fin 42b is located in protection layer 24. Each fin 42b is flush with the upper surface of layer 24. The upper surface of layer 24 corresponds to the surface opposite to the surface in contact with support 16. In other words, the upper surfaces of fins 42b are coplanar with the upper surface of layer 24. Fins 42b are thus in contact with the environment surrounding the package, for example, in contact with air. The upper surface of the package, corresponding to FIG. 3, thus comprises fins 42b surrounded with regions of layer 24. Preferably, the fins are all in a same upper plane. Preferably, the upper plane having fins 42b located therein is parallel to the lower plane having main portion 42a located therein.

Element 42 further comprises intermediate portions or coupling portions 42c. Each fin 42b is coupled to main portion 42a by an intermediate portion 42c. The intermediate portions thus cross layer 24. Each intermediate portion 42c extends from central portion 42a to one of the fins.

Intermediate portions 42c are preferably inclined. In other words, each intermediate portion forms an angle a with the normal direction, that is, a direction orthogonal to the plane of main portion 42a. Angle a is preferably greater than 5°, preferably in the range from 5° to 45°. An angle smaller than 5° would risk damaging element 42 at the level of the angles and would not ensure as good a holding of element 42 in layer 24.

The proportion of the upper surface of the package corresponding to the fins is, for example, in the range from 40% to 90%. Such a proportion is sufficiently high to allow a significant heat dissipation surface area. Further, such a proportion enables to surround the fins with regions of layer 24, which enables to ensure the holding of element 42.

Preferably, in the embodiment of FIGS. 2 and 3, central portion 42a has the shape of a cuboid. Thus, in top view, main portion 42a has the shape of a rectangle. A fin 42b is located in line with each side of said rectangle.

In the embodiment of FIGS. 2 and 3, the fins are identical to one another, only differing by their orientation.

Each fin has, in top view, an irregular hexagonal shape. More precisely, each fin 42b comprises a portion 42b1 having the shape of a cuboid, and thus the shape of a rectangle in top view, and a portion 42b2 having, in top view, the shape of a trapezoid, preferably an isosceles trapezoid. Portion 42b2 is located between portion 42b1 and intermediate portion 42c.

Portions 42b1 and 42b2 are contiguous to each other at the level of a length of the rectangle and of the long base of the trapezoid. In other words, the rectangle of portion 42b1 shares a side with the trapezoid of portion 42b2. A length of the rectangle of portion 42b1 corresponds to the long base of the trapezoid of portion 42b2. Thus, the length of the rectangle and the long base of the trapezoid preferably have the same length.

Portion 42b2 and intermediate portion 42c are contiguous to each other at the level of the short base of the trapezoid and of a length of portion 42c. In other words, the trapezoid of portion 42b2 shares a side with the side of portion 42c most distant from central portion 42a. Thus, the length of portion 42c and the short base of the trapezoid preferably have the same length.

In top view, each width of the trapezoids of portions 42b2 is, for example, parallel to the width of another trapezoid of the closest neighboring portion 42b2. The term widths designates the sides coupling the long and short bases, the short and long bases being parallel to each other.

Preferably, fins 42b are separated from one another by regions of layer 24. Similarly, intermediate portions 42c are preferably separated from one another by regions of layers 24. Thus, each fin and each intermediate portion is surrounded by layer 24, which enables to ensure the holding of element 42.

Preferably, the fins extend in front of regions surrounding main portion 42a. In other words, the fins preferably do not cover the region of layer 24 covering main portion 42a.

Element 42, that is, portions 42a, 42b, and 42c, is made of a thermally-conductive material, for example, a metal, for example, of copper. The expression thermal conductor designates a material having a thermal conductivity greater than 390 W/mK. Element 42 is preferably made of a single material, for example, of a single metal. Element 42 preferably is a single block, manufactured from a same metal plate (in other words, it is a unitary or monolithic body made of said single metal material).

During the die operation, the die generates heat which is transmitted to main portion 42a by mechanical contact. The heat is then transmitted to intermediate portions 42c, and then to fins 42b. The heat is then dissipated in the environment of the package by the surfaces of the fins in contact with said environment, for example, with air.

Preferably, a region 44 of layer 24, delimited in top view by the widths of the two fins and by the edges of the package, is located in each corner of the package in top view. In other words, the upper surface of layer 24 comprises regions 44, into which the fins do not extend. Regions 44 enable to write information on the package, for example, codes or references, which would be difficult to perform on the fins.

Element 42 is not in physical or electric contact with wires 22 and pads 20. In other words, element 42 is separated from wires 22 and from pads 20 by regions of layer 24. In particular, the dimensions and the inclination of intermediate portions 42c are such that the intermediate portions are separated from wires 22 by regions of layer 24.

The upper plane, having fins 42b located therein, and the lower plane, having main portion 42a located therein, are separated by a distance sufficient for the fins not to be in contact with wires 22, that is, are separated from wires 22 by a region of layer 24. Further, said distance is sufficient for element 42 to be held in place, that is, to be well anchored in layer 24 and not to risk being displaced. Preferably, the distance between the upper plane and the lower plane, that is, for example, between the plane comprising the lower surfaces of the fins and the plane comprising the upper surface of main portion 42, is for example greater than 90 nm, and more particularly is for example greater than 100 nm.

The presence of a plurality of fins separated by regions of layer 24 ensures that layer 24 is continuous, which enables to improve the holding of the layer and of element 42 by the layer. The term continuous means that all the regions of layer 24, that is, all the regions made of the material of layer 24 covering the upper surface of the support, the die, and element 42, are physically linked to one another.

As a variant, the fins may have a different shape. For example, each fin may have the shape of a cuboid having a side common with a side of an intermediate portion.

Figure 4:
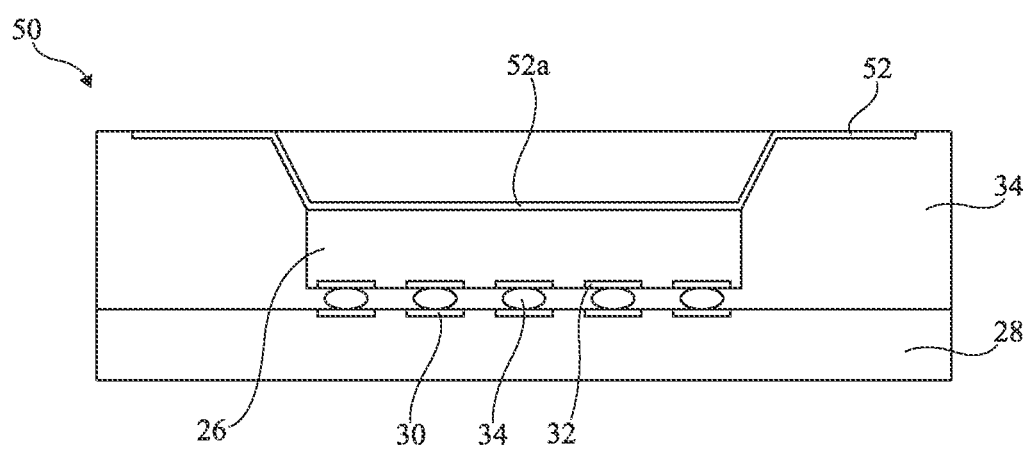
FIG. 4 shows a cross-section view of a variant of the embodiment of FIG. 2.

FIG. 4 shows a cross-section view of a variant of the embodiment of FIG. 2. More precisely, FIG. 4 shows an embodiment of a device 50 comprising a heat dissipating element, the device being a "flip chip"-type device, such as that described in relation with view B of FIG. 1.

Device 50 comprises, like the device 12 of FIG. 1, support 28, conductive tracks 30, balls 34, die 26, and layer 34.

Device 50 further comprises heat dissipation element 52 such as the heat dissipation element 42 described in relation with FIGS. 2 and 3.

Element 52 differs from element 42 in that element 52 may entirely cover the upper surface of die 26. In other words, a main portion 52a of element 52, corresponding to the portion 42a of element 42, covers at least a portion of the upper surface of die 26, for example, the entire upper surface of die 26.

According to an embodiment, the dimensions of the lower surface of portion 52a, that is, the surface closest to die 26, are at least equal to the dimensions of the upper surface of die 26. This enables to maximize the surface area of heat exchange between the die and element 52 and, in the case where the dimensions of the lower surface of portion 52a are greater than the dimensions of the upper surface of die 26, this enables to be less subject to alignment problems.

Figure 5:
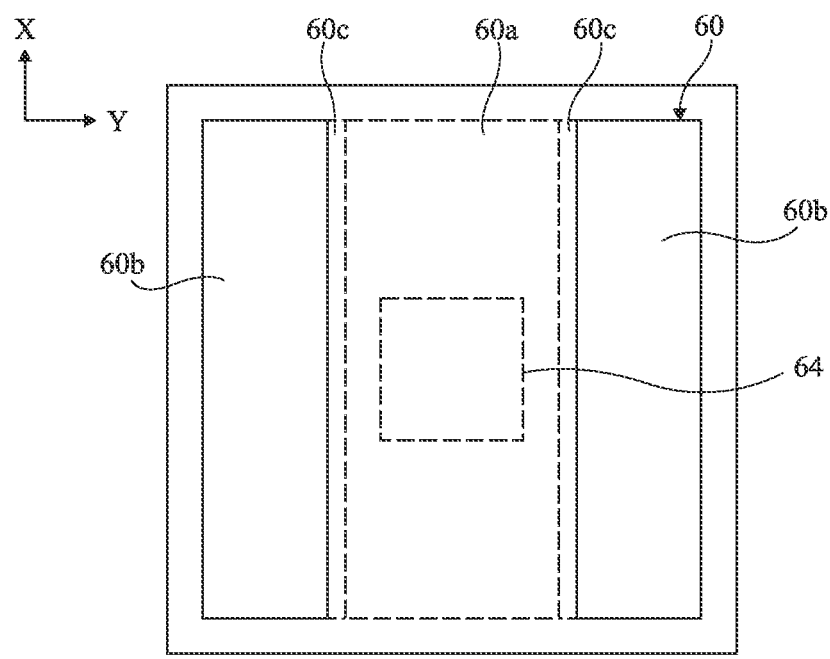
FIG. 5 shows a top view of a variant of the embodiment of FIG. 2.

More generally, the heat dissipation element 42 in FIGS. 2 and 3, and heat dissipation element 52 in FIG. 4, may have a shape different from the shape described in relation with FIGS. 2 to 4. FIG. 5 illustrates another embodiment of a dissipation element, capable of being used in connection with the embodiment of FIGS. 2 and 3 and to the embodiment of FIG. 4.

The heat dissipation element may have another shape, the element being made of a thermally-conductive material and comprising a main portion resting on at least a portion of an upper surface of the die, at least one secondary portion flush with an upper surface of the package, and at least one intermediate portion coupling the main portion to the at least one secondary portion.

FIG. 5 shows a top view of a variant of the embodiment of FIG. 2. More precisely, FIG. 5 illustrates the shape of a heat dissipation element 60, capable of being applied to the embodiments of FIGS. 2 to 4.

Element 60 differs from elements 42 and 52 in that element 60 only comprises two fins 62b, the fins being located on opposite sides of main portion 60a.

In the embodiment of FIG. 5, main portion 60a entirely covers a die 64, for example corresponding to the die 26 of FIG. 4.

Main portion 60a, for example, extends over the most part of a dimension of the package, for example, between 75% and 95% of the dimensions of the package in a direction X. Similarly, fins 60b and the intermediate portions extend, in direction X, all along the length of portion 60a. Main portion 60a further extends in a direction Y orthogonal to direction X, and in the plane of the upper surface of the package. In the embodiment of FIG. 5, portion 60a extends, in direction Y, across a width greater than the dimension of die 64.

According to another embodiment, the shape of element 60 may be configured for use with wired packages of the type of the embodiment of FIG. 2, if the dimension of portion 60a in direction Y is smaller than the dimension of the die in the same direction.

FIGS. 6A-6E show an implementation mode of a method of manufacturing the embodiment of FIG. 2. More precisely, FIGS. 6A, 6B, 6C, 6D, and 6E illustrate steps of the method of manufacturing the embodiment of FIG. 2. The steps illustrated in FIGS. 6A, 6B, 6C, 6D, and 6E, referred to as corresponding steps A, B, C, D, and E hereafter, are preferably successive. More precisely, steps A, B, D, and E are preferably successive. Step C may be carried out before steps A and B, or in parallel with steps A and B. Step C is carried out before step D.

Step A (FIG. 6A) comprises the forming of support 16. Step A thus comprises, for example, the forming of an interconnection network in support 16, in particular the forming of conductive tracks and of conductive vias. The forming of support 16 comprises the forming of conductive tracks 18 flush with the upper surface of support 16 around the region in front of die 14.

Step A (FIG. 6A) further comprises the forming of die 14. In particular, the forming of die 14 comprises the forming of pads 20 at the level of the upper surface of die 14. Pads 20 are, for example, located in the die and are, for example, flush with the upper surface of die 14. Pads 20 may also rest on the upper surface of die 14.

Step A (FIG. 6a) further comprises the bonding of die 14 to support 16. The bonding, for example, comprises the deposition of glue on the lower surface of die 14, that is, the surface opposite to the surface having pads 20 located thereon. The lower surface of die 14 is then bonded to the upper surface of the support by the glue layer. Die 14 is preferably bonded between tracks 18. Die 14 preferably covers no track 18 flush with the upper surface of support 16.

Step B (FIG. 6B) comprises the forming of wires 22. Wires 22 are in contact with tracks 18 and pads 20. Each wire 22 forms an electric connection between a pad 20 and a track 18. Wires 22 are, for example, welded to the pads and conductive tracks. It will be noted that in the case of the implementation shown in FIGS. 1B and 4, this step would be replaced by a step for electrically connecting the flip chip arrangement to the pads 20.

Step C (FIG. 6C) comprises the forming of element 42. The forming of element 42 comprises the cutting, in a metal plate or sheet, of planarized element 42. The planarized shape of element 42 is then folded at the level of the limits between main portion 42a and intermediate portions 42c, and at the level of the limits between intermediate portions 42c and fins 42b, to form element 42. This may, for example, be implemented using a metal stamping operation.

Element 42 is thus formed of a single block (in other words, it is a unitary or monolithic body). The forming of element 42 thus comprises no step of bonding of the different portions of element 42 to one another.

Step D (FIG. 6D) comprises the bonding of element 42 to die 14. Element 42 is, for example, bonded to die 14 by a layer of thermal glue, not shown. Element 42 is placed on die 14 so that element 42 is not in contact with wires 22 and pads 20.

Step E (FIG. 6E) comprises the forming of protection layer 24. Layer 24 is, for example, made of resin. Layer 24 is, for example, formed by molding. Layer is formed to cover, preferably entirely, the upper surface of the support, wires 22, tracks 18, pads 20, portions 42a and 42c of element 42. Layer 42 is formed so that portions 42b, that is, the fins, are not totally exposed. Layer 42 is formed so that the upper surfaces of portions 42b remain exposed, that is, are not covered with layer 24.

Figure 6A:
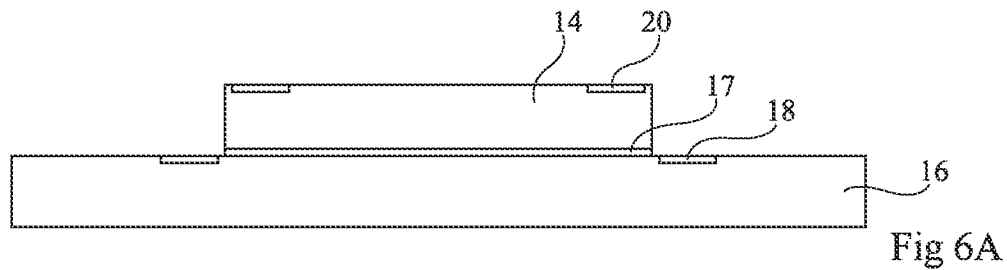
FIGS. 6A-6E show an implementation mode of a method of manufacturing the embodiment of FIG. 2.
Figure 6B:
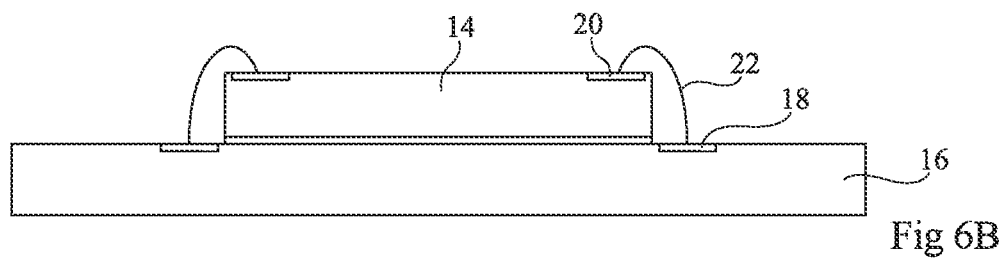
Figure 6C:
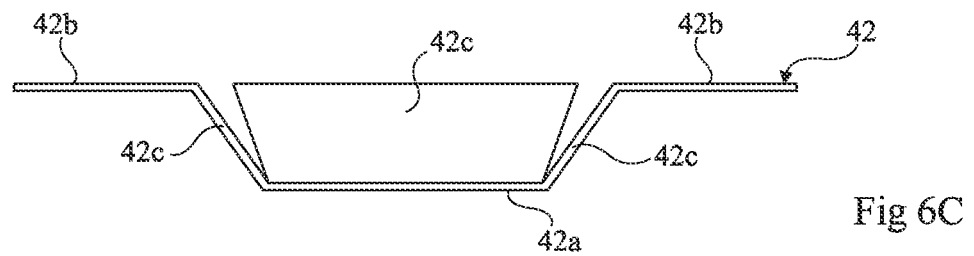
Figure 6D:
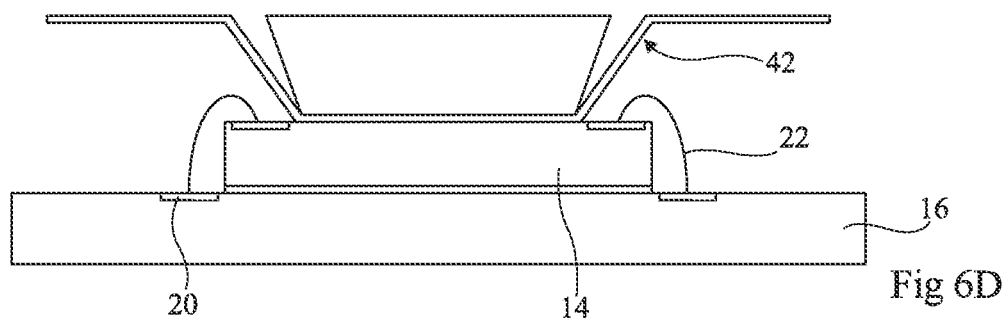
Figure 6E:
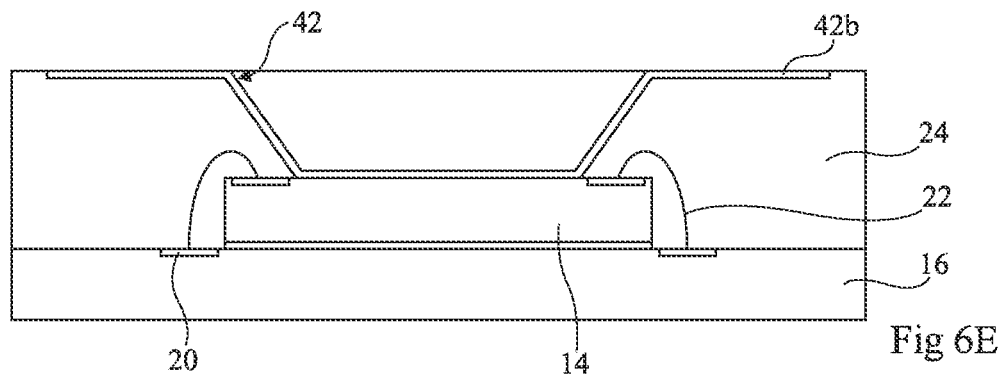

The method of manufacturing the embodiment of FIG. 4 differs from the embodiment described in relation with FIGS. 6A and 6B are replaced with a step comprising: the forming of support 28, comprising the forming of conductive tracks 30; the forming of die 26, comprising the forming of pads 32; and the bonding of die 26 to the support, by means of solder balls 34, which are for example melted between tracks 30 and pads 32.

The shape of the heat diffusion element may be different from that described in relation with FIG. 3. The manufacturing method is then identical except for step C to obtain the heat diffusion element having the desired shape.

An advantage of the described embodiment is that they may be configured for use with different types of die packages.

Another advantage of the described embodiments is that they enable to diffuse more heat than known heat extractors.

An advantage of the described embodiments is that the addition of a diffuser according to the embodiments does not impact the die, the substrate or the electronic components and, in particular, does not impact their placements.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

The invention claimed is:

1. An electronic device, comprising:
an electronic die within a package; and
a heat diffusion element made of a thermally-conductive material;
wherein said heat diffusion element comprises:
a main portion resting on at least a portion of an upper surface of the electronic die;
at least one secondary portion flush with an upper surface of the package; and
at least one intermediate portion coupling the main portion to the at least one secondary portion;
wherein each secondary portion is formed of a first portion having the shape of a rectangle and a second portion having the shape of a trapezoid, one side of the rectangle and a long base of the trapezoid being contiguous.

2. The device according to claim 1, wherein the heat diffusion element is formed of a single block.

3. The device according to claim 2, wherein the main portion is located in a first plane and the at least one secondary portion is located in a second plane, the first and second planes being distinct and parallel.

4. The device according to claim 3, wherein said at least one intermediate portion extends at an angle relative to a perpendicular from the first and second planes.

5. The device according to claim 3, wherein a distance between the first and second planes is greater than 90 nm.

6. The device according to claim 1, wherein the main portion rests on at least 75% of the upper surface of the electronic die.

7. The device according to claim 1, wherein the electronic die is electrically coupled to a support by a lower surface of the electronic die, the main portion entirely covering the upper surface of the electronic die.

8. The device according to claim 1, wherein the electronic die is electrically coupled to a support by electric wires, the main portion partially covering the upper surface of the electronic die.

9. The device according to claim 8, wherein the package comprises a protection layer, the at least one secondary portion being flush with an upper surface of the protection layer.

10. The device according to claim 9, wherein the main portion is covered with a region of the protection layer.

11. The device according to claim 9, wherein the electric wires are separated from the heat diffusion element by a region of the protection layer.

12. The device according to claim 1, wherein the main portion is bonded to the electronic die by thermal glue.

13. The device according to claim 1, wherein the heat diffusion element comprises four secondary portions and four intermediate portions, each secondary portion being coupled by one of the intermediate portions to a different side of the main portion.

14. The device according to claim 1, wherein the at least one intermediate portion forms an angle with a normal direction orthogonal to the main portion in a range from 5° to 45°.

15. An electronic device, comprising:
an electronic die; and
a heat diffusion element made of a thermally-conductive material;
wherein said heat diffusion element comprises:
a main portion on a first plane mounted to an upper surface of the electronic die;
at least one secondary portion on a second plane; and
at least one intermediate portion coupling the main portion to the at least one secondary portion and extending at an angle relative to a perpendicular from the first and second planes;
wherein said at least one secondary portion comprises a first portion having, in the second plane, the shape of a rectangle and a second portion having, in the second plane, the shape of a trapezoid, one side of the rectangle and a long base of the trapezoid being contiguous.

16. The device according to claim 15, wherein the electronic die is encapsulated within a package having an upper surface coplanar with the second plane.

17. The device according to claim 16, wherein the package further encapsulates the main portion and the at least one intermediate portion.

18. The device according to claim 15, wherein the heat diffusion element is formed of a single block.

19. The device according to claim 15, wherein the heat diffusion element comprises four secondary portions and four intermediate portions, each secondary portion being coupled by one of the intermediate portions to a different side of the main portion.

20. The device according to claim 15, wherein the at least one intermediate portion forms an angle with a normal direction orthogonal to the first and second planes in a range from 5° to 45°.

* * * * *